(12) United States Patent
Cha et al.

(10) Patent No.: US 6,780,691 B2
(45) Date of Patent: Aug. 24, 2004

(54) METHOD TO FABRICATE ELEVATED SOURCE/DRAIN TRANSISTOR WITH LARGE AREA FOR SILICIDATION

(75) Inventors: Randall Cher Liang Cha, Singapore (SG); Yeow Kheng Lim, Singapore (SG); Alex Kai Hung See, Singapore (SG); Jia Zhen Zheng, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 10/222,410

(22) Filed: Aug. 16, 2002

(65) Prior Publication Data

US 2004/0033668 A1 Feb. 19, 2004

(51) Int. Cl.[7] ............................................. H01L 21/00
(52) U.S. Cl. ...................... 438/161; 438/514; 438/556; 257/288; 257/412
(58) Field of Search ................................ 438/161, 424, 438/514, 556, 586, 648, 647; 257/288, 412

(56) References Cited

U.S. PATENT DOCUMENTS

| | | | |
|---|---|---|---|
| 5,539,229 A | * 7/1996 | Noble, Jr et al. ............ | 257/301 |
| 5,716,861 A | * 2/1998 | Moslehi ...................... | 438/586 |
| 6,090,672 A | 7/2000 | Wanlass ...................... | 438/301 |
| 6,090,691 A | 7/2000 | Ang et al. .................... | 438/564 |
| 6,207,517 B1 | 3/2001 | Muller ........................ | 438/301 |
| 6,271,132 B1 | 8/2001 | Xiang et al. ................. | 438/682 |
| 6,333,247 B1 | * 12/2001 | Chan et al. .................. | 438/586 |

* cited by examiner

Primary Examiner—Caridad Everhart
(74) Attorney, Agent, or Firm—George O. Saile; Rosemary L. S. Pike

(57) ABSTRACT

A method for forming a transistor having an elevated source/drain structure is described. A gate electrode is formed overlying a substrate and isolated from the substrate by a gate dielectric layer. Isolation regions are formed in and on the substrate wherein the isolation regions have a stepped profile wherein an upper portion of the isolation regions partly overlaps and is offset from a lower portion of the isolation regions in the direction away from the gate electrode. Ions are implanted into the substrate between the gate electrode and the isolation regions to form source/drain extensions. Dielectric spacers are formed on sidewalls of the gate electrode and the isolation regions. A conductive layer is deposited overlying the substrate, the gate electrode, and the isolation regions and planarized to leave the conductive layer adjacent to the gate electrode and separated from the gate electrode by the dielectric spacers wherein the conductive layer forms elevated source/drain junctions and wherein the elevated source/drain junctions completely overlie the source/drain extensions and wherein an upper portion of the elevated source/drain junctions extends into the stepped portion of the isolation regions thereby completing formation of a MOSFET having an elevated source/drain structure.

37 Claims, 10 Drawing Sheets

METHOD TO FABRICATE ELEVATED SOURCE/DRAIN TRANSISTOR WITH LARGE AREA FOR SILICIDATION

BACKGROUND OF THE INVENTION (1) Field of the Invention

The invention relates to the fabrication of integrated circuit devices, and more particularly, to a method of forming an elevated source/drain transistor structure having a large area for silicidation in the fabrication of integrated circuits.

(2) Description of the Prior Art

The utilitarian features in forthcoming semiconductor devices are small gate dimensions and shallow source/drain junctions. As we await the maturity and development of compatible techniques to assure shallow junctions with high dopant activation for a lower Schottky barrier between metallic contact and doped silicon, we may require raised or elevated source/drain features to fan out current crowding and lower the series resistance.

New techniques of making elevated source/drain features are being proposed. U.S. Pat. No. 6,090,691 to Ang et al discloses damascene gate and source/drain process with raised polysilicon source/drain regions. U.S. Pat. No. 6,207,517 to Muller teaches a raised polysilicon source/drain process. U.S. Pat. No. 5,271,132 to Xiang et al shows raised source/drain contacts. U.S. Pat. No. 6,090,672 to Wanless shows a metal gate process.

SUMMARY OF THE INVENTION

A principal object of the present invention is to provide an effective and very manufacturable method of forming a transistor having elevated source/drain structures.

A further object of the invention is to provide a method of forming a transistor having an elevated source/drain structure and a large silicon area for silicidation.

Yet another object is to provide a method of forming a transistor having an elevated source/drain structure with a large area for silicidation wherein the source/drain structure may be doped polysilicon or a metal.

In accordance with the objects of this invention a method for forming a transistor having an elevated source/drain structure is achieved. A gate electrode is formed overlying a substrate and isolated from the substrate by a gate dielectric layer. Isolation regions are formed in and on the substrate wherein the isolation regions have a stepped profile wherein an upper portion of the isolation regions partly overlaps and is offset from a lower portion of the isolation regions in the direction away from the gate electrode. Ions are implanted into the substrate between the gate electrode and the isolation regions to form source/drain extensions. Dielectric spacers are formed on sidewalls of the gate electrode and the isolation regions. A conductive layer is deposited overlying the substrate, the gate electrode, and the isolation regions and planarized to leave the conductive layer adjacent to the gate electrode and separated from the gate electrode by the dielectric spacers wherein the conductive layer forms elevated source/drain junctions and wherein the elevated source/drain junctions completely overlie the source/drain extensions and wherein an upper portion of the elevated source/drain junctions extends into the stepped portion of the isolation regions thereby completing formation of a MOSFET having an elevated source/drain structure in the fabrication of an integrated circuit device.

Also in accordance with the objects of this invention a MOSFET device having an elevated source/drain structure is achieved. A gate electrode overlies a substrate, isolated from the substrate by a gate dielectric layer. Isolation regions lie in and on the substrate wherein the isolation regions have a stepped profile wherein an upper portion of the isolation regions partly overlaps and is offset from a lower portion of the isolation regions in the direction away from the gate electrode. Source/drain extensions in the substrate lie between the isolation regions and the gate electrode. Elevated source/drain junctions overlie the substrate adjacent to the gate electrode and separated from the gate electrode by dielectric spacers wherein the elevated source/drain junctions completely overlie the source/drain extensions and wherein an upper portion of the elevated source/drain junctions extends into the stepped portion of the isolation regions thereby increasing the area of the elevated source/drain junctions.

BRIEF DESCRIPTION OF THE DRAWINGS

In the accompanying drawings forming a material part of this description, there is shown.

DESCRIPTION OF THE PREFERRED EMBODIMENTS

The present invention not only allows elevated source/drain features to be built, but also offers a large silicon area for silicidation. Two preferred embodiments are described with reference to FIGS. 1–9 and 10–20, respectively. The two preferred embodiments differ in the method of forming the isolation regions.

Figure 1:
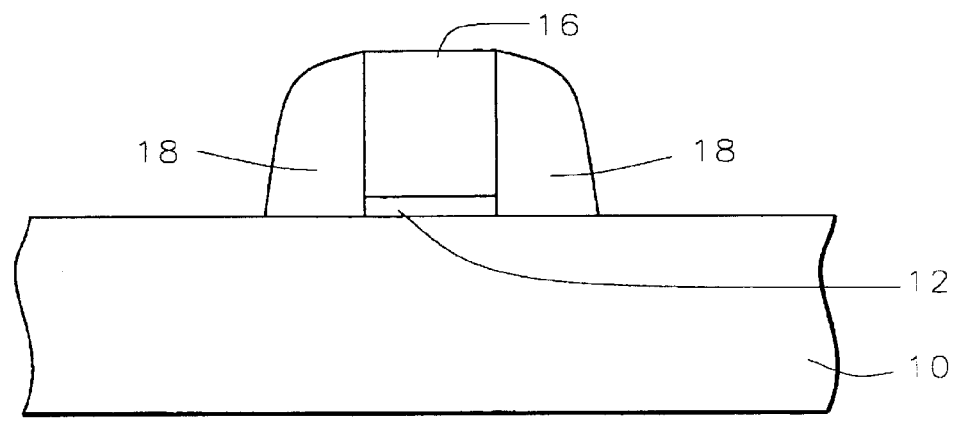
FIGS. 1 through 9 schematically illustrate in cross-sectional representation a first preferred embodiment of the present invention.

The first preferred embodiment will be described with reference to FIGS. 1–9. Referring now more particularly to FIG. 1, there is shown an illustration of a portion of a partially completed transistor. The semiconductor substrate 10 is preferably composed of silicon having a (100) crystallographic orientation and has been doped to be a p-type substrate. It will be understood by those skilled in the art that while FIGS. 1 through 9 illustrate an N channel MOSFET integrated circuit device, a P channel FET integrated circuit device could be formed simply by substituting opposite polarities to those given for the N channel embodiment. Also, in a similar way, a CMOSFET could be formed by making both N channel and P channel devices upon the same substrate.

A gate electrode 16 is formed over the substrate. A gate dielectric layer 12 isolates the gate electrode from the silicon substrate. First sidewall spacers 18 are formed on the gate electrode. For example, a silicon nitride layer may be deposited over the substrate and anisotropically etched back to leave silicon nitride spacers 18 on the sidewalls of the gate electrode. Preferably the first spacers have a width of between about 4000 and 6000 Angstroms.

Figure 2:
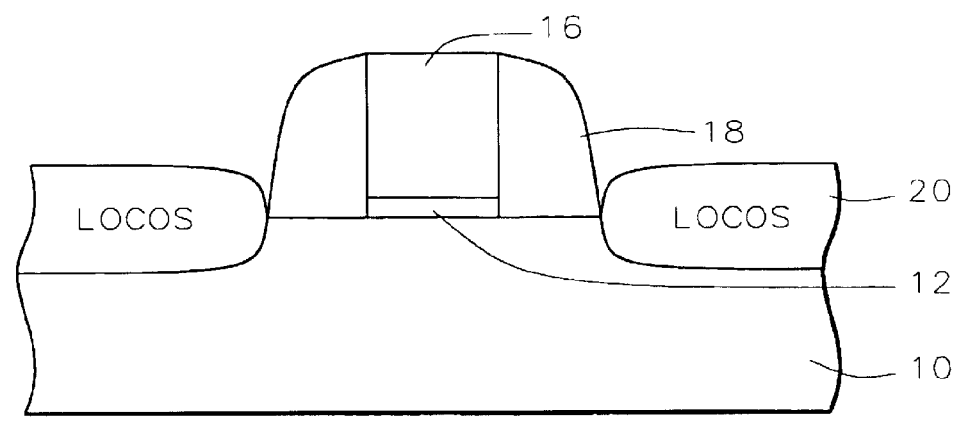
Figure 3:
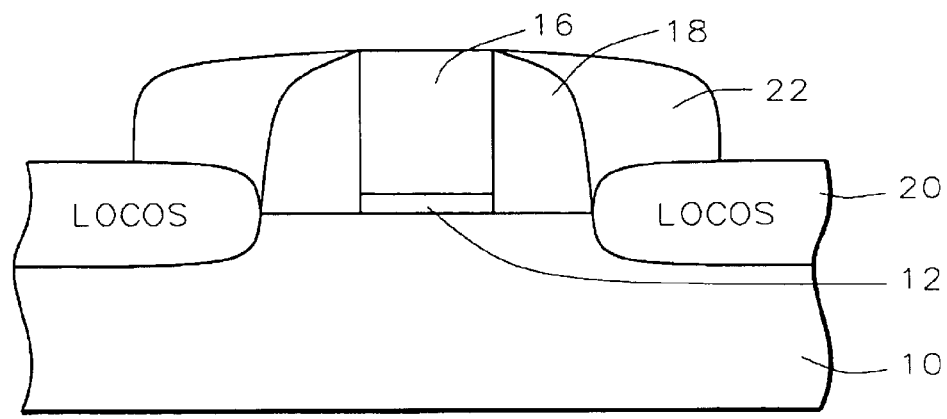

Referring now to FIG. 2, local oxidation of silicon is performed to form LOCOS isolation regions 20 adjacent to the sidewall spacers. Now, a second set of sidewall spacers 22 are formed on the first spacers and overlying a portion of the LOCOS regions, as illustrated in FIG. 3. The second spacers 22 are of a similar material to the first spacers 18 so that both sets of spacers can be removed in a single step. Preferably the second spacers have a width of between about 2000 and 3000 Angstroms.

Figure 4:
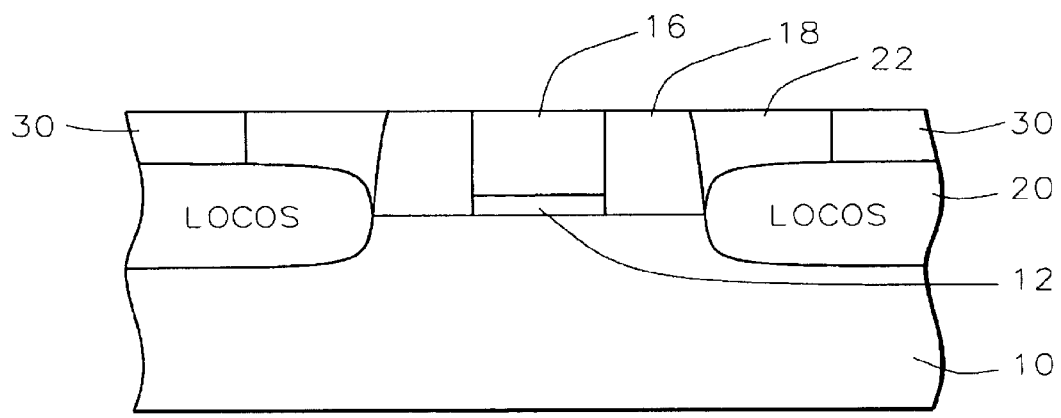

Referring now to FIG. 4, an oxide layer 30 is deposited over the gate electrode and spacers and planarized such as by chemical mechanical polishing (CMP). Now the spacers 18 and 22 are removed in a one step process, such as a wet etch in hot phosphoric acid which is a well-known process to strip silicon nitride with good selectivity to oxide.

Figure 5:
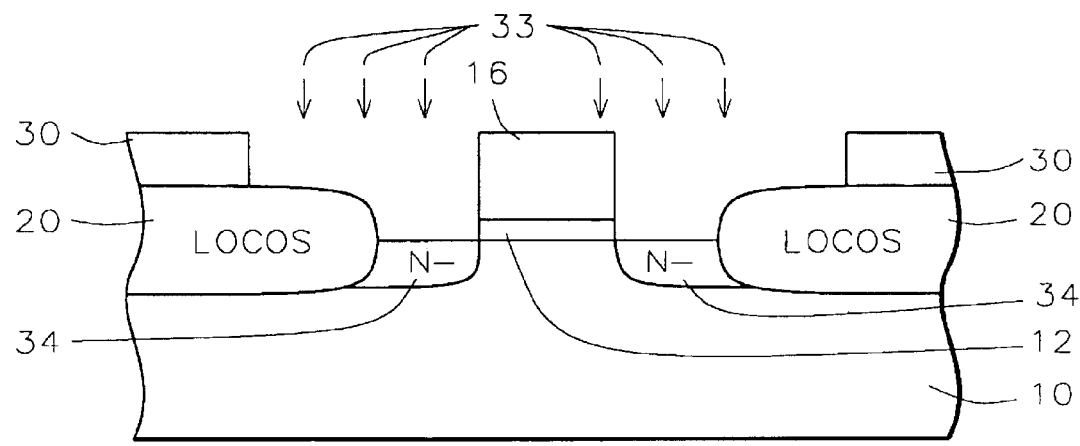

FIG. 5 shows the integrated circuit device after the spacers have been removed. Ions 33 are implanted into the substrate adjacent to the gate electrode to form lightly doped regions 34.

A third set of spacers 36 are formed on the sidewalls of the gate electrode 16, LOCOS regions 20, and oxide regions 30. The spacers 36 may comprise silicon nitride. Preferably, these spacers 36 are much narrower than the first and second spacers, having a width of between about 400 and 600 Angstroms. The third spacers 36 are shown in FIG. 6.

Figure 6:
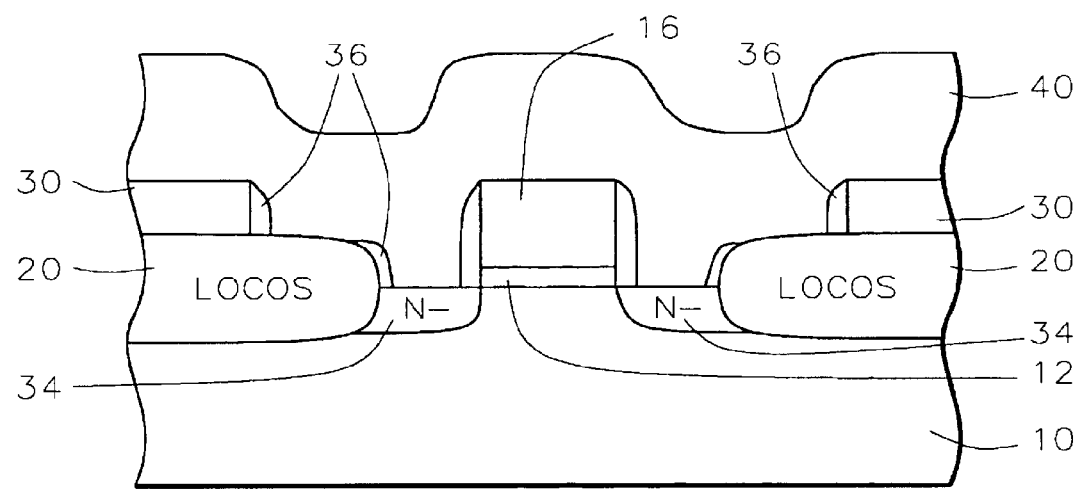

Now a conducting layer 40 is blanket deposited over the wafer and filling all the gaps as shown in FIG. 6. The conducting layer may be doped polysilicon. Alternatively, the conducting layer may be a triple layer of titanium, titanium nitride, and tungsten. The titanium layer has a preferred thickness of between about 100 and 200 Angstroms. The titanium nitride is formed over the titanium layer to a thickness of between about 150 and 300 Angstroms. The tungsten layer is deposited over the titanium nitride layer to a thickness of between about 3000 and 5000 Angstroms.

Figure 7:
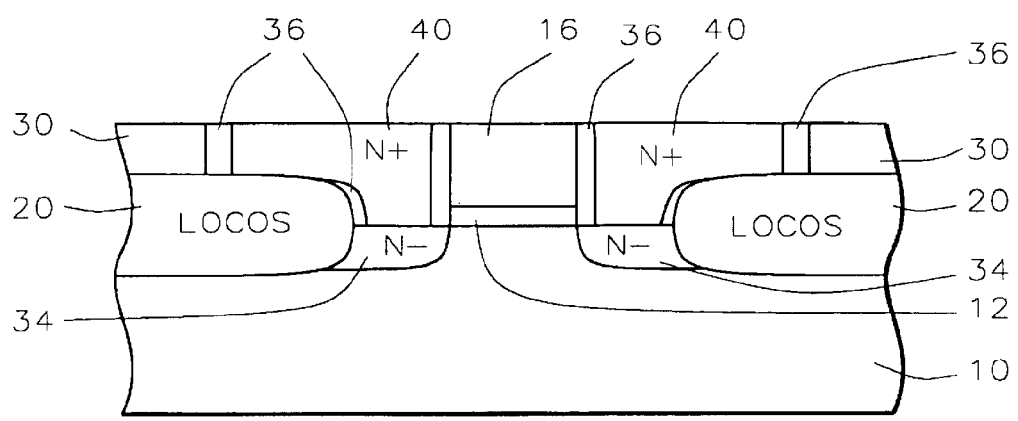
Figure 8:
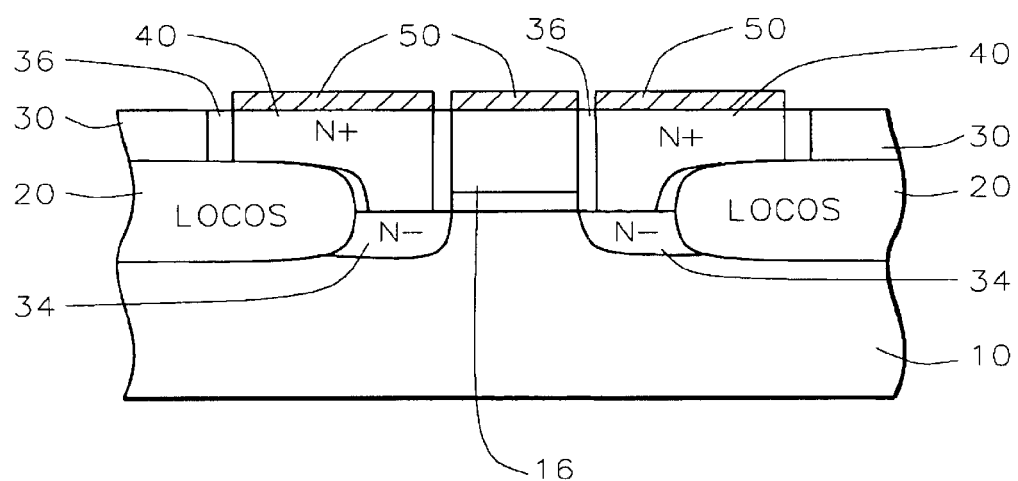

Now, the conducting layer is planarized such as by CMP with an overpolish to remove all of the conducting layer except where is fills the gaps between the gate electrode 16 and the oxide regions 30 to insure isolation between the gate and the conducting layer 40. The conducting layer 40 forms elevated source/drain regions, as shown in FIG. 7. These elevated source/drain regions have a larger area than just that area overlying the lightly doped regions 34 within the substrate. Many prior art processes have a small silicon area 40 for silicidation. Thus, the quality of the silicide formed is usually mediocre owing to stress-related problems. The process of the present invention provides a larger area for silicidation, leading to higher quality silicide. FIG. 8 illustrates the integrated circuit device after the elevated source/drain regions 40 and the gate electrode 16 have been silicided 50.

Figure 9:
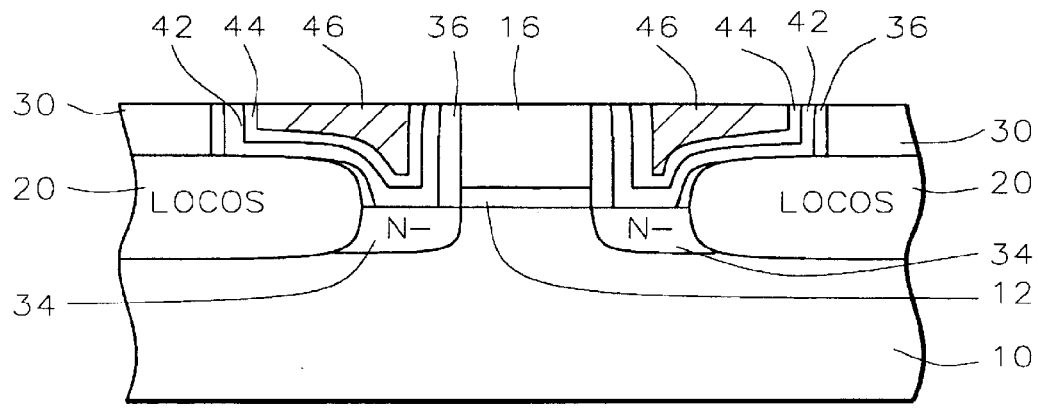

FIG. 9 illustrates the alternative wherein the conducting layer comprises Ti/TiN/W instead of polysilicon. Here the elevated source/drain regions comprise titanium layer 42, titanium nitride layer 44, and tungsten layer 46. Silicidation is unnecessary in this case since the source/drain regions are metal.

Figure 10:
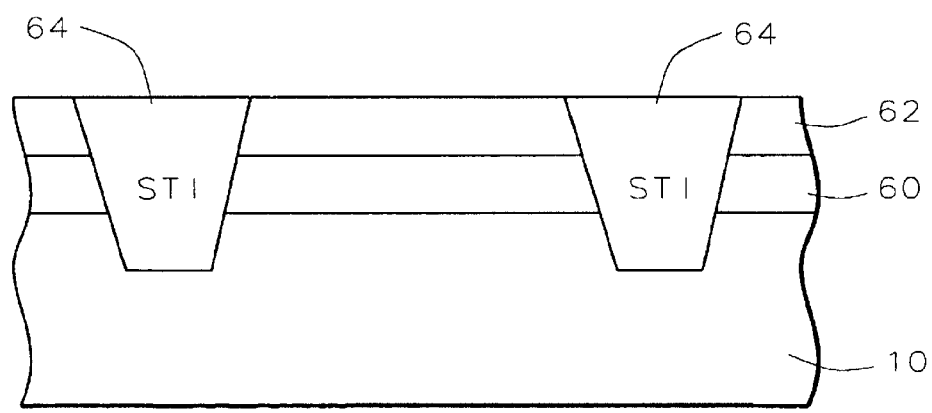
FIGS. 10 through 20 schematically illustrate in cross-sectional representation a second preferred embodiment of the present invention.

The second preferred embodiment will now be described with reference to FIGS. 10–20. Referring now more particularly to FIG. 10, there is shown an illustration of a portion of a partially completed integrated circuit device. The semiconductor substrate 10 is preferably composed of silicon having a (100) crystallographic orientation and has been doped to be a p-type substrate. It will be understood by those skilled in the art that while FIGS. 10 through 16 illustrate an N channel MOSFET integrated circuit device, a P channel FET integrated circuit device could be formed simply by substituting opposite polarities to those given for the N channel embodiment. Also, in a similar way, a CMOSFET could be formed by making both N channel and P channel devices upon the same substrate.

In this embodiment, isolation is in the form of shallow trench isolation (STI) instead of the LOCOS isolation of the first embodiment. A pad oxide layer 60 is provided over the semiconductor substrate 10 having a thickness of between about 100 and 200 Angstroms. A hard mask layer 62 is deposited over the pad oxide layer. The hard mask layer 62 may be silicon nitride having a thickness of between about 1500 and 2500 Angstroms. Trenches are etched through the hard mask and the pad oxide layers and into the silicon substrate. The trenches are filled with an insulating layer and planarized to complete the STI regions 64, as shown in FIG. 10.

Figure 11:
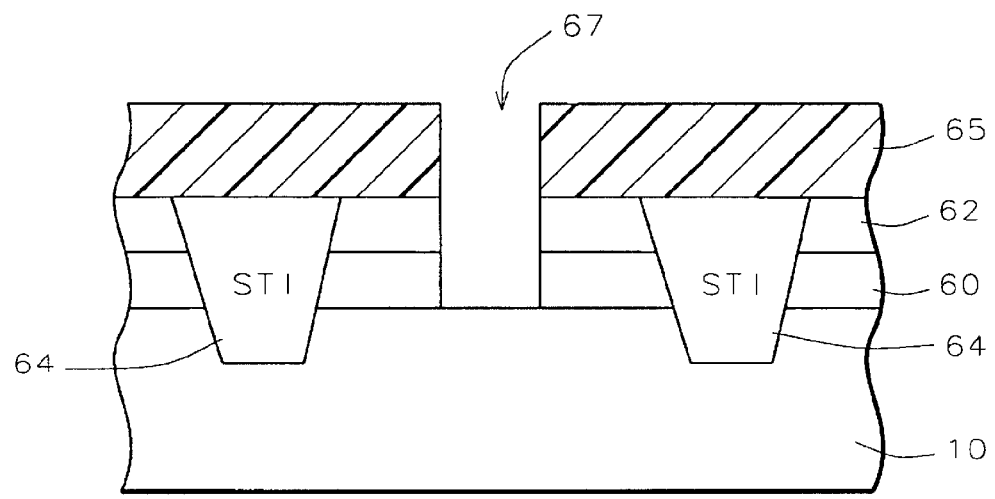
Figure 12:
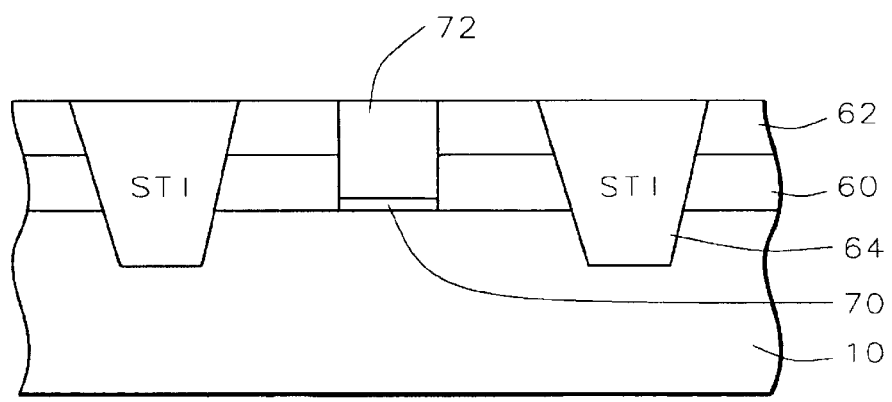

Referring now to FIG. 11, the hard mask and the pad oxide layer are patterned to form an opening 67 to the substrate. For example, photoresist mask 65 is used to pattern the opening.

A gate dielectric layer 70 is grown or deposited overlying the substrate within the opening 67. A polysilicon gate electrode 72 is formed, for example, by a damascene process where the polysilicon layer is deposited over the hard mask layer and into the opening 67. The polysilicon layer is polished such as by CMP to remove the polysilicon except where it remains within the opening to form the polysilicon gate electrode 72.

Figure 13:
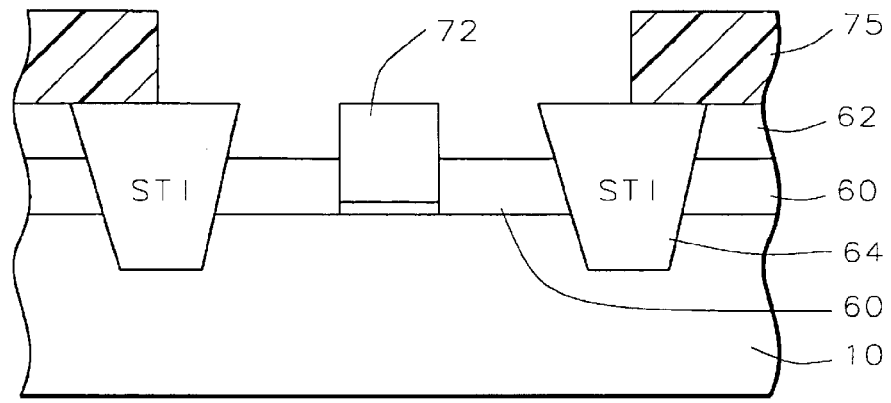
Figure 14:
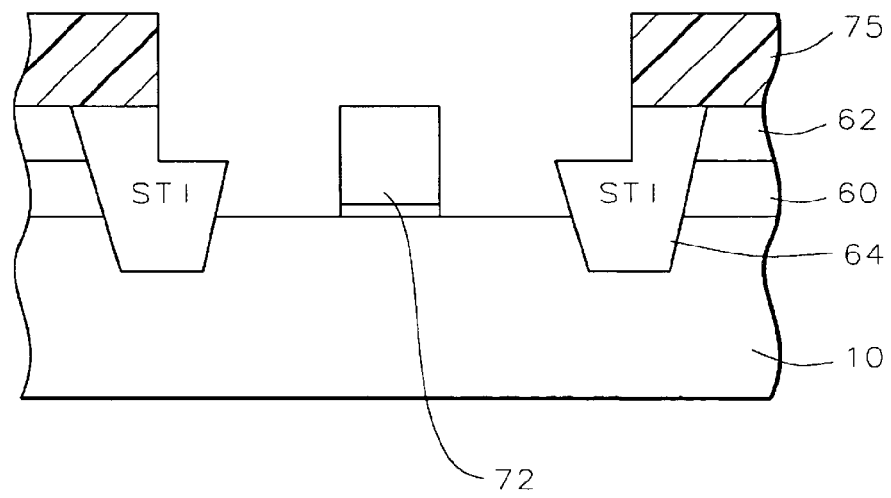

Referring now to FIG. 13, the hard mask layer 62 is removed by conventional lithography and plasma etching, for example. Photoresist mask 75 is shown. Now an oxide etch removes the oxide surrounding the gate 72 and the exposed corner regions of the STI, as shown in FIG. 14.

Figure 15:
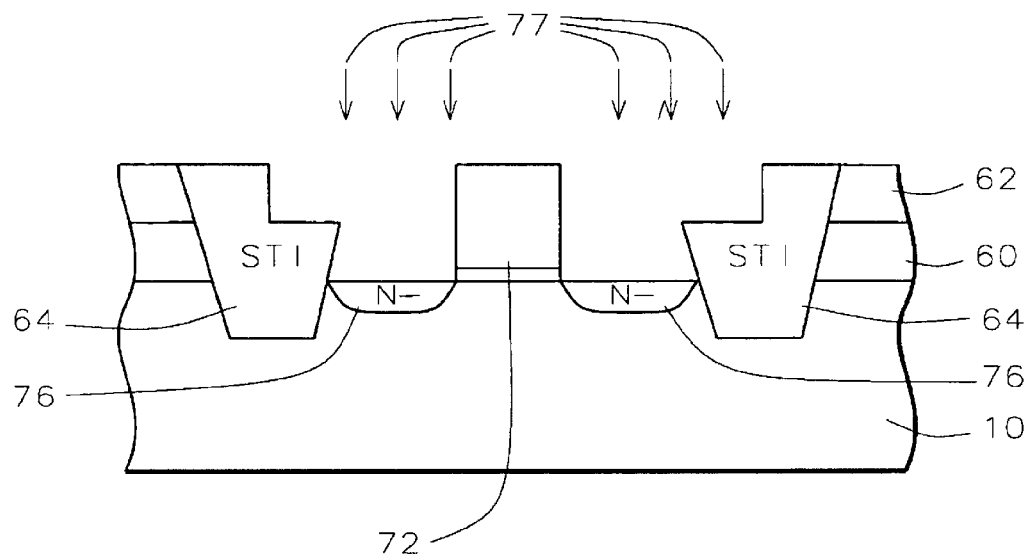
Figure 16:
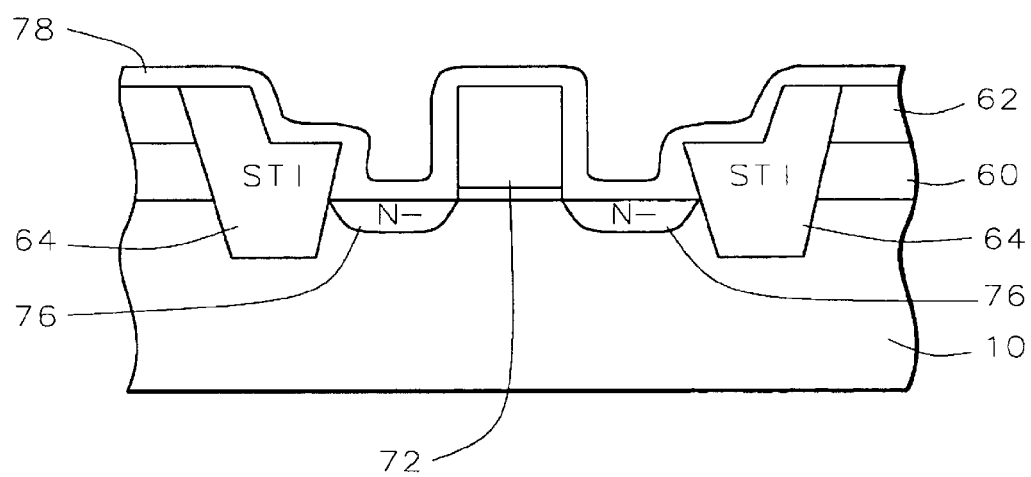

Ions 77 are implanted into the substrate adjacent to the gate electrode to form lightly doped regions 76, as shown in FIG. 15. As illustrated in FIG. 16, a conformal dielectric layer 78 is deposited over the surface of the wafer. This layer 78 may be silicon nitride or tetraoxysilane (TEOS) oxide, for example, having a thickness of between about 500 and 800 Angstroms. The dielectric layer 78 is anisotropically etched back to leave spacers 80 on the sidewalls of the gate electrode 72 and STI regions 64. Preferably, these spacers 80 have a width of between about 500 and 800 Angstroms. The spacers are shown in FIG. 17.

Figure 17:
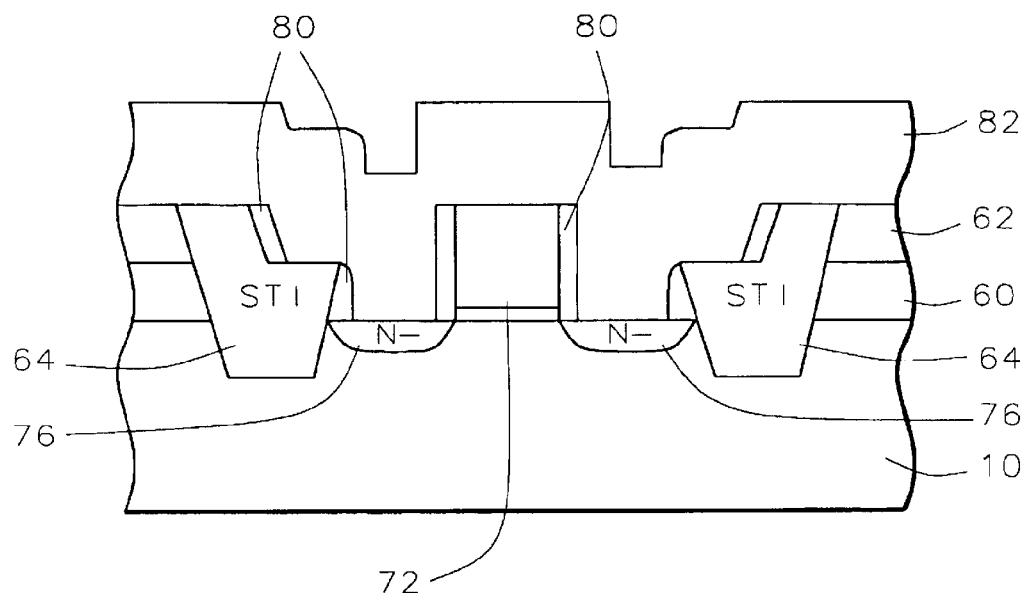
Figure 18:
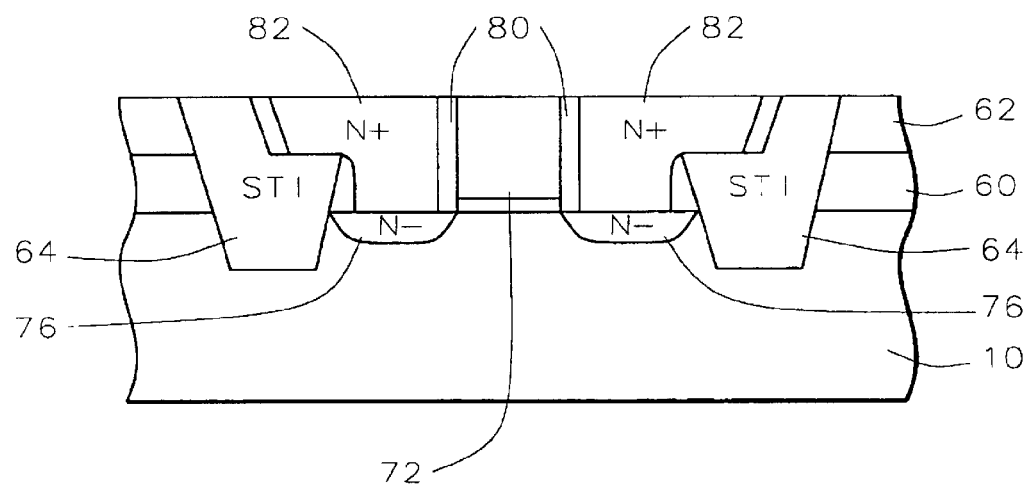

Now a conducting layer 82 is blanket deposited over the wafer and filling all the gaps as shown in FIG. 17. The conducting layer may be doped polysilicon. Alternatively, the conducting layer may be a triple layer of titanium, titanium nitride, and tungsten. The titanium layer has a preferred thickness of between about 100 and 200 Angstroms. The titanium nitride is formed over the titanium layer to a thickness of between about 150 and 300 Angstroms. The tungsten layer is deposited over the titanium nitride layer to a thickness of between about 3000 and 5000 Angstroms, or as much as necessary to fill the gaps.

Figure 19:
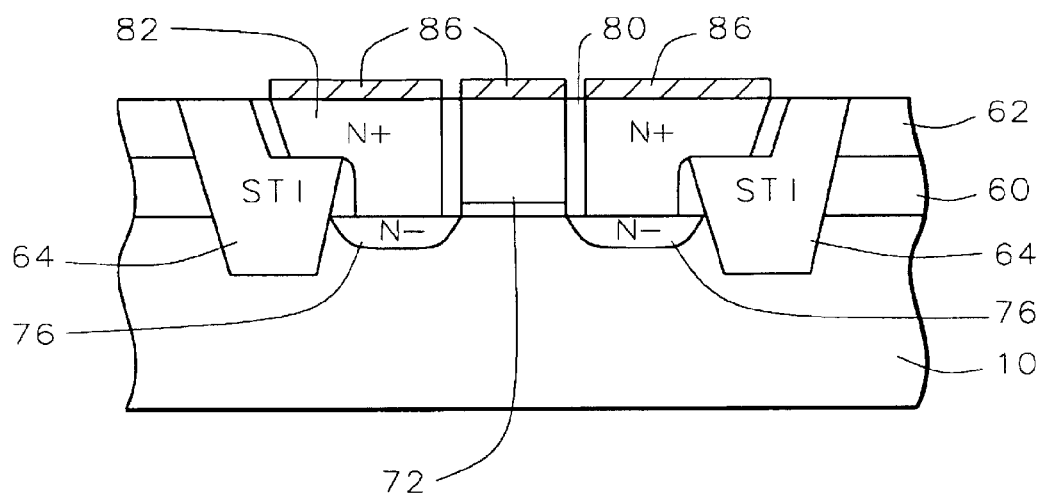

Now, the conducting layer is planarized such as by CMP with an overpolish to remove all of the conducting layer except where it fills the gaps between the gate electrode 72 and the STI regions 64 to insure isolation between the gate and the conducting layer 82. The conducting layer 82 forms elevated source/drain regions. These elevated source/drain regions have a larger area than just that area overlying the lightly doped regions 76 within the substrate. As in the first embodiment, the process of the present invention provides a larger area for silicidation, leading to higher quality silicide. FIG. 19 illustrates the integrated circuit device after the polysilicon elevated source/drain regions 82 and the gate electrode 72 have been silicided 86.

Figure 20:
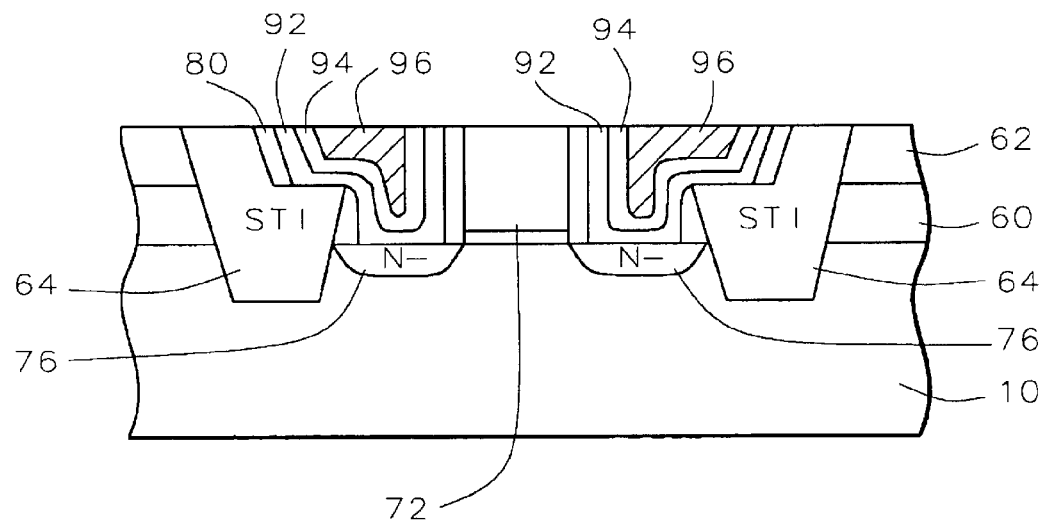

FIG. 20 illustrates the alternative wherein the conducting layer comprises Ti/TiN/W instead of polysilicon. Here the elevated source/drain regions comprise titanium layer 92, titanium nitride layer 94, and tungsten layer 96. Silicidation is unnecessary in this case since the source/drain regions are metal.

The process of the present invention provides a new method for fabricating an elevated source/drain transistor. The present invention also provides a large silicon source/drain area for silicidation alleviating poor quality problems in the silicide. In addition, the present invention allows the option of replacing the heavily doped source/drain regions with metals.

While the invention has been particularly shown and described with reference to the preferred embodiments thereof, it will be understood by those skilled in the art that various changes in form and details may be made without departing from the spirit and scope of the invention.

What is claimed is:

1. A method of forming a MOSFET having an elevated source/drain structure in the fabrication of an integrated circuit device comprising:

providing a gate electrode overlying a substrate and isolated from said substrate by a gate dielectric layer;

forming isolation regions in and on said substrate wherein said isolation regions have a stepped profile wherein an upper portion of said isolation regions partly overlaps and is offset from a lower portion of said isolation regions in the direction away from said gate electrode wherein said step of forming said isolation regions comprises:

forming first dielectric spacers on sidewalls of said gate electrode;

performing local oxidation of silicon to form said lower portion of said isolation regions in and on said substrate adjacent to said first spacers;

forming second dielectric spacers overlying said lower portion of said isolation regions and adjacent to said first spacers;

forming an oxide layer overlying said lower portion of said isolation regions wherein said oxide layer forms said offset upper portion of said isolation regions; and thereafter removing said first and second spacers;

implanting ions into said substrate between said gate electrode and said isolation regions to form source/drain extensions;

forming dielectric spacers on sidewalls of said gate electrode and said isolation regions; and depositing a conductive layer overlying said substrate, said gate electrode, and said isolation regions and planarizing said conductive layer to leave said conductive layer adjacent to said gate electrode and separated from said gate electrode by said dielectric spacers wherein said conductive layer forms elevated source/drain junctions and wherein said elevated source/drain junctions completely overlie said source/drain extensions and wherein an upper portion of said elevated source/drain junctions extends into said stepped portion of said isolation regions thereby completing formation of said MOSFET having an elevated source/drain structure in the fabrication of said integrated circuit device.

2. The method according to claim 1 wherein said dielectric spacers comprise silicon nitride having a width of between about 400 and 600 Angstroms.

3. The method according to claim 1 wherein said conductive layer comprises doped polysilicon.

4. The method according to claim 1 wherein said step of depositing said conductive layer comprises:

depositing a titanium layer overlying said substrate, said gate electrode, said isolation regions, and said dielectric spacers;

depositing a titanium nitride layer overlying said titanium layer; and depositing a tungsten layer overlying said titanium nitride layer.

5. The method according to claim 4 wherein said titanium layer has a thickness of between about 100 and 200 Angstroms.

6. The method according to claim 4 wherein said titanium nitride layer has a thickness of between about 150 and 300 Angstroms.

7. The method according to claim 3 further comprising siliciding said gate electrode and said elevated source/drain junctions.

8. The method according to claim 1 wherein said gate electrode comprises polysilicon.

9. A method of forming a MOSFET having an elevated source/drain structure in the fabrication of an integrated circuit device comprising:

providing a gate electrode overlying a substrate and isolated from said substrate by a gate dielectric layer;

forming first dielectric spacers on sidewalls of said gate electrode;

forming isolation regions in and on said substrate adjacent to said first spacers;

forming second dielectric spacers overlying said isolation regions and adjacent to said first spacers;

forming an oxide layer overlying said isolation regions;

thereafter removing said first and second spacers thereby exposing said substrate adjacent to said gate electrode;

implanting ions into said exposed substrate to form source/drain extensions;

thereafter forming third dielectric spacers on sidewalls of said gate electrode, said isolation regions, and said oxide layer; and depositing a conductive layer overlying said substrate, said gate electrode, said isolation regions, and said oxide layer and planarizing said conductive layer to leave said conductive layer adjacent to said gate electrode and separated from said gate electrode by said third spacers wherein said conductive layer forms elevated source/drain junctions thereby completing formation of said MOSFET having an elevated source/drain structure in the fabrication of said integrated circuit device.

10. The method according to claim 9 wherein said gate electrode comprises polysilicon.

11. The method according to claim 9 wherein said first dielectric spacers comprise silicon nitride having a width of between about 4000 and 6000 Angstroms.

12. The method according to claim 9 wherein said second dielectric spacers comprise silicon nitride having a width of between about 2000 and 3000 Angstroms.

13. The method according to claim 9 wherein said step of forming isolation regions in and on said substrate adjacent to said first spacers comprises local oxidation of silicon.

14. The method according to claim 9 wherein said step of forming an oxide layer overlying said isolation regions comprises:

depositing an oxide layer overlying said gate electrode, said first and second spacers, and said isolation regions; and polishing away said oxide layer leaving said oxide layer only overlying said isolation regions wherein said oxide layer partly overlapping and offset from said isolation regions in the direction away from said gate electrode.

15. The method according to claim 9 wherein said step of removing said first and second spacers is a single step removal process.

16. The method according to claim 9 wherein said third dielectric spacers comprise silicon nitride having a width of between about 400 and 600 Angstroms.

17. The method according to claim 9 wherein said conductive layer comprises doped polysilicon.

18. The method according to claim 9 wherein said step of depositing said conductive layer comprises:

depositing a titanium layer overlying said substrate, said gate electrode, said oxide layer, said isolation regions, and said third spacers;

depositing a titanium nitride layer overlying said titanium layer; and depositing a tungsten layer overlying said titanium nitride layer.

19. The method according to claim 18 wherein said titanium layer has a thickness of between about 100 and 200 Angstroms.

20. The method according to claim 18 wherein said titanium nitride layer has a thickness of between about 150 and 300 Angstroms.

21. The method according to claim 17 further comprising siliciding said gate electrode and said elevated source/drain junctions.

22. A method of forming a MOSFET having an elevated source/drain structure in the fabrication of an integrated circuit device comprising:

providing a pad oxide layer overlying a substrate;

depositing a hard mask layer overlying said pad oxide layer;

etching trenches through said hard mask layer and said pad oxide layer into said substrate and filling said trenches with a dielectric layer to form shallow trench isolation regions;

etching an opening through said hard mask layer and said pad oxide layer to said substrate;

providing a gate dielectric layer overlying said substrate within said opening;

forming a gate electrode overlying said gate dielectric layer within said opening;

thereafter removing said hard mask layer;

removing said pad oxide layer adjacent to said gate electrode thereby exposing said substrate wherein part of an upper portion of said shallow trench isolation regions are also removed;

thereafter implanting ions into said exposed substrate to form source/drain extensions;

thereafter forming dielectric spacers on sidewalls of said gate electrode and said shallow trench isolation regions; and depositing a conductive layer overlying said substrate, said gate electrode, said isolation regions, and said oxide layer and planarizing said conductive layer to leave said conductive layer adjacent to said gate electrode and separated from said gate electrode by said dielectric spacers wherein said conductive layer extends outward from said gate electrode over a part of a lower portion of said shallow trench isolation regions wherein said conductive layer forms elevated source/drain junctions thereby completing formation of said MOSFET having an elevated source/drain structure in the fabrication of said integrated circuit device.

23. The method according to claim 22 wherein said hard mask layer comprises silicon nitride.

24. The method according to claim 22 wherein said dielectric layer comprises an oxide.

25. The method according to claim 22 wherein said gate electrode comprises polysilicon.

26. The method according to claim 22 wherein said dielectric spacers comprise silicon nitride having a width of between about 500 and 800 Angstroms.

27. The method according to claim 22 wherein said conductive layer comprises doped polysilicon.

28. The method according to claim 22 wherein said step of depositing said conductive layer comprises:

depositing a titanium layer overlying said substrate, said gate electrode, said oxide layer, said isolation regions, and said third spacers;

depositing a titanium nitride layer overlying said titanium layer; and depositing a tungsten layer overlying said titanium nitride layer.

29. The method according to claim 28 wherein said titanium layer has a thickness of between about 100 and 200 Angstroms.

30. The method according to claim 28 wherein said titanium nitride layer has a thickness of between about 150 and 300 Angstroms.

31. The method according to claim 27 further comprising siliciding said gate electrode and said elevated source/drain junctions.

32. A MOSFET having an elevated source/drain structure in an integrated circuit device comprising:

a gate electrode overlying a substrate and isolated from said substrate by a gate dielectric layer;

isolation regions in and on said substrate wherein said isolation regions have a stepped profile wherein an upper portion of said isolation regions partly overlaps and is offset from a lower portion of said isolation regions in the direction away from said gate electrode;

source/drain extensions in said substrate lying between said isolation regions and said gate electrode;

elevated source/drain junctions overlying said substrate adjacent to said gate electrode and separated from said gate electrode by dielectric spacers wherein said elevated source/drain junctions completely overlie said source/drain extensions and wherein an upper portion of said elevated source/drain junctions extends into said stepped portion of said isolation regions thereby increasing the area of said elevated source/drain junctions; and a silicide layer overlying said gate electrode and said elevated source/drain junctions.

33. The device according to claim 32 wherein said gate electrode comprises polysilicon.

34. The device according to claim 32 wherein said isolation regions comprise local oxidation of silicon as said lower portion of said isolation regions and a deposited oxide layer as said offset upper portion of said isolation regions.

35. The device according to claim 32 wherein said isolation regions comprise shallow trench isolation regions that have been patterned to form said stepped profile.

36. The device according to claim 32 wherein said elevated source/drain junctions comprise doped polysilicon.

37. The device according to claim 32 wherein said elevated source/drain junctions comprise:

a titanium layer overlying said substrate said isolation regions, and said spacers;

a titanium nitride layer overlying said titanium layer; and a tungsten layer overlying said titanium nitride layer.

* * * * *